(12) United States Patent
Wong et al.

(10) Patent No.: US 7,197,722 B2
(45) Date of Patent: Mar. 27, 2007

(54) OPTIMIZATION OF SAMPLE PLAN FOR OVERLAY

(75) Inventors: Alan Wong, San Jose, CA (US); Jeff Drautz, Rio Rancho, NM (US); Joseph D. Shindler, Gaston, OR (US); Max Lau, San Ramon, CA (US); George Chen, Los Gatos, CA (US)

(73) Assignee: Intel Corporation, Santa Clara, CA (US)

( * ) Notice: Subject to any disclaimer, the term of this patent is extended or adjusted under 35 U.S.C. 154(b) by 355 days.

(21) Appl. No.: 10/956,608

(22) Filed: Sep. 30, 2004

(65) Prior Publication Data

US 2006/0074611 A1 Apr. 6, 2006

(51) Int. Cl.
*G06F 17/50* (2006.01)

(52) U.S. Cl. .............................. 716/2; 716/19; 716/20; 716/21; 703/14

(58) Field of Classification Search .................... 716/2, 716/19, 20, 21; 703/14
See application file for complete search history.

(56) References Cited

U.S. PATENT DOCUMENTS

2004/0022444 A1* 2/2004 Rhoads ....................... 382/232
2004/0162687 A1* 8/2004 Smith et al. .................. 702/85

\* cited by examiner

*Primary Examiner*—Thuan Do
(74) *Attorney, Agent, or Firm*—George Chen

(57) ABSTRACT

The present invention describes a method including: determining field-clustering scheme; selecting initial sample plan; establishing initial model of overlay, the initial model of overlay comprising components; and establishing efficient model of overlay from the initial model of overlay including: constructing matrices; identifying redundant components and eliminating the redundant components; and identifying highly-correlated components and determining whether to eliminate the highly-correlated components.

18 Claims, 1 Drawing Sheet

and more specifically, to a method of optimizing a sample plan for measuring overlay.

OPTIMIZATION OF SAMPLE PLAN FOR OVERLAY

BACKGROUND OF THE INVENTION

1. Field of the Invention

The present invention relates to the field of semiconductor integrated circuit manufacturing, and more specifically, to a method of optimizing a sample plan for measuring overlay.

2. Discussion of Related Art

Integrated Circuit (IC) devices may be fabricated on a substrate, such as a wafer, that is usually made from semiconducting material, such as silicon. Various types of materials may be added to, or removed from, the wafer during processing. The materials may include insulating material, such as silicon oxide, or conducting material, such as copper.

Some processes that may be used to add a material to the wafer include chemical vapor deposition, sputtering, electroplating, oxidation, and ion implantation. Other processes that may be used to remove a material, partially or completely, from the wafer include wet etching, dry etching, and chemical-mechanical polishing. Photolithography may be used to selectively process certain portions of the wafer.

Many parameters of the IC devices must be monitored during fabrication to ensure that the specifications for performance and reliability may be met. Since IC device fabrication involves many layers, it is important to ensure that the overlay, or placement of a layer relative to another layer, falls within a certain acceptable tolerance.

However, as the wafer becomes larger and the design rules become tighter, a sample plan for measuring overlay may be difficult to optimize.

DETAILED DESCRIPTION OF THE PRESENT INVENTION

Figure 1:
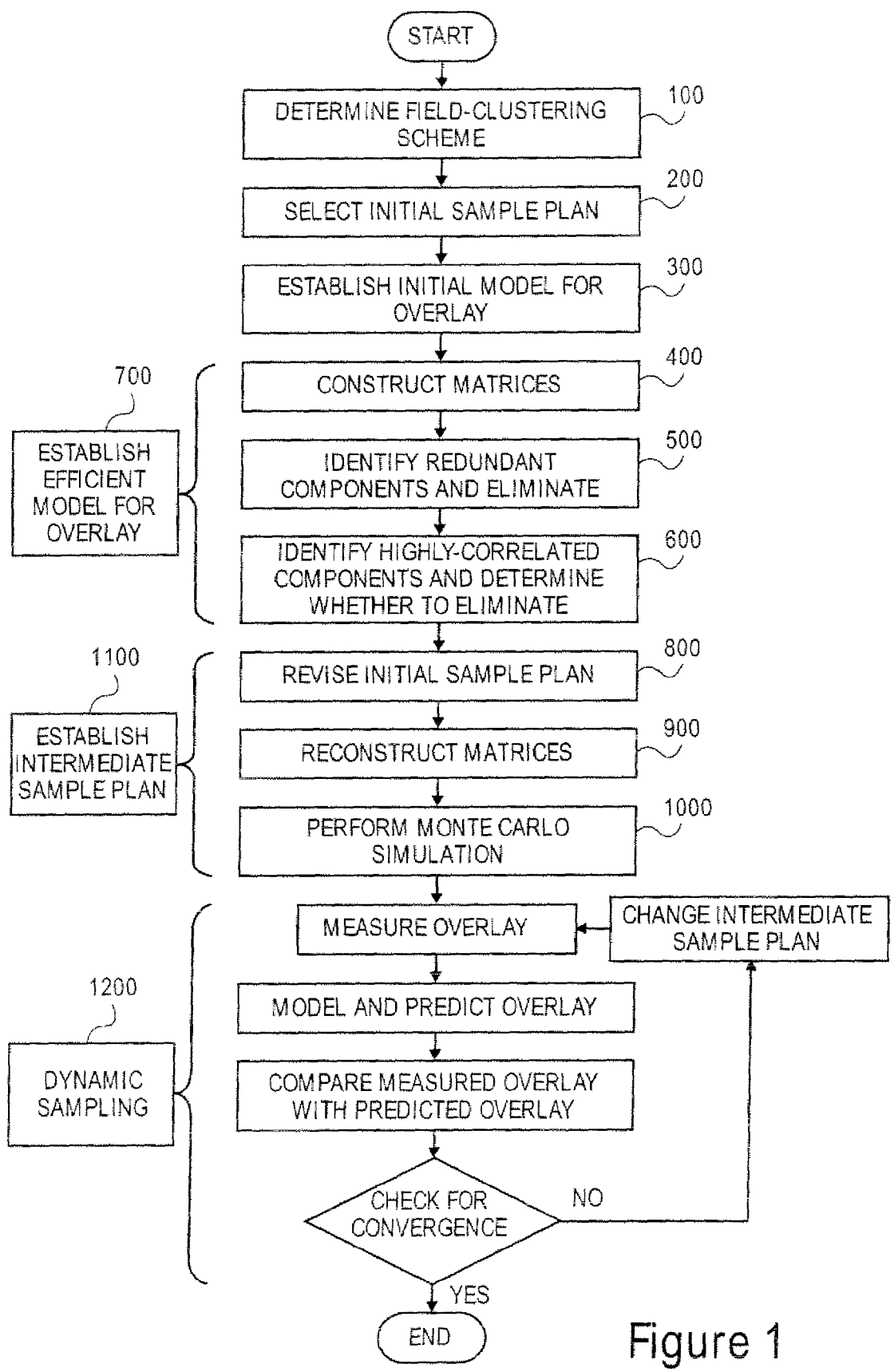
FIG. 1 is an illustration of a method of optimizing an overlay sample plan according to an embodiment of the present invention.

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

A sample plan for measuring overlay in photolithography may be optimized according to various embodiments of the present invention. Patterning of a layer of a wafer may include an imaging process followed by a transfer process. The imaging process may include photolithography. The transfer process may be predominantly additive, such as ion implantation, or predominantly subtractive, such as etch.

First, the wafer may be cleaned and pretreated. Then, the wafer may be spin-coated with a radiation-sensitive material, such as a photoresist, on a track. Next, the photoresist on the wafer may be stabilized with a soft bake on a hot plate prior to the wafer being placed on a chuck in an imaging tool.

When a wafer stepper or a wafer scanner serves as the imaging tool, a surface of the wafer may be subdivided into fields that may be individually exposed to the radiation. The fields may be arranged contiguously across the wafer in a grid with a uniform periodicity, such as in rows and columns. Each field may include one or more dice. A die may include an integrated circuit (IC) device. Neighboring dice may be separated by a scribeline. The scribeline may also be known as a street or a kerf.

The imaging tool may use a photomask to form a pattern in the photoresist on the wafer. The pattern may include features for forming the layers of the IC device. The isolation, gate, contact, and first metal layers of the IC device may be considered critical layers since they include features with stringent design rules. Other layers of the IC device may include less-critical layers and non-critical layers.

The photomask used in the wafer stepper or the wafer scanner may be known as a reticle. A set of about 15–45 different reticles may be used to form the layers of the IC device. Many layers may only require use of a single reticle that may be specific to the layer. However, certain layers may require use of multiple reticles, such as gate layer which may use an alternating phase-shifting mask (APSM) and a trim mask.

According to an embodiment of the present invention, a first step in optimizing a sample plan for measuring overlay may be to determine a field-clustering scheme for a second-print pattern relative to a first-print pattern (FIG. 1, block 100).

The field-clustering scheme may depend on the alignment strategy used to align the second-print pattern to the first-print pattern. The first-print pattern may include a pattern formed in the wafer at an earlier layer. The second-print pattern may include a pattern to be formed in the photoresist on the wafer at a subsequent layer.

An alignment of the subsequent layer to an alignment mark formed on the earlier layer may be known as a direct alignment or a first-order alignment. The alignment mark may include features having various shapes, dimensions, and polarities that may be nested or grouped in an array. In an embodiment of the present invention, the features of the alignment mark may be distinguishable structurally, such as by shape, size, or step height, from other features on the wafer. In another embodiment of the present invention, the features of the alignment mark may be distinguishable optically, such as by brightness or contrast, from other features on the wafer.

Radiation be provided by a source, such as a lamp or a laser, to illuminate the wafer in an area where the alignment mark may be located. The bandwidth of the radiation may be broad or narrow. The radiation may include a single nominal wavelength or multiple nominal wavelengths. A brightfield or a darkfield mode may be selected if desired. The alignment mark may be detected by an alignment sensing subsystem that may be off-axis, through-the-lens (TTL) on-axis, or TTL off-axis. The axis may refer to an optical path of a projection optics (PO) package in the imaging tool. In an embodiment of the present invention, the alignment sensing subsystem of the imaging tool may acquire a scan of the alignment mark on the wafer to recognize an alignment signal. In another embodiment of the present invention, the alignment sensing subsystem of the imaging tool may capture an image of the alignment mark on the wafer to recognize the alignment signal.

In an embodiment of the present invention, the alignment may be performed with parallel or concurrent operations. In another embodiment of the present invention, the alignment may be performed with serial or sequential operations, such as a coarse alignment operation followed by a fine alignment operation. Each operation may include a search routine that may be repeated or iterated depending on certain criteria for convergence. The fine alignment on the wafer may include a global alignment based on multiple fields or separate alignment based on individual fields.

In an embodiment of the present invention, the coarse alignment marks and the fine alignment marks may be designed using different shapes and sizes. In another embodiment of the present invention, the coarse alignment marks and the fine alignment marks may be placed in different locations on the wafer and in the field.

In an embodiment of the present invention, the alignment marks may permit a determination of offset, orientation, size, and shape of the grid on the wafer. In another embodiment of the present invention, the alignment marks may permit a determination of offset, orientation, size, and shape of the field in the grid.

In an embodiment of the present invention, the first-print pattern and the second-print pattern may be exposed with the same nominal field size. This may be known as a concentric field-clustering scheme. In the concentric field-clustering scheme, the center of the second-print pattern may be placed directly over the center of the field of the first-print pattern.

In another embodiment of the present invention, the first-print pattern and the second-print pattern may be exposed with different nominal field sizes. A smaller field size may permit a higher performance for the IC device since tighter control of critical dimension (CD) and overlay may be delivered by the imaging tool. On the other hand, a larger field size may permit a higher throughput for the imaging tool since a total number of steps needed to expose the photoresist in the fields across the wafer may be reduced. A compromise between performance and throughput may be accomplished by limiting use of smaller fields to the critical layers while permitting use of larger fields for the less-critical and the non-critical layers. This may be known as a non-concentric field-clustering scheme. In the non-concentric field-clustering scheme, the center of the second-print pattern is not placed over the center of the first-print pattern.

The non-concentric field-clustering scheme may be implemented in many ways. In an embodiment of the present invention, the field size of the second-print pattern may be an integer multiple (1:n) of the field size of the first-print pattern, where n may be 2, 3, 4, and so forth. Then, a single second-print of a wide field may be placed over an integer multiple, such as 2, 3, or 4, first-print of narrow fields. Such a non-concentric field-clustering scheme may be referred to as 1:2, 1:3, or 1:4. In an embodiment of the present invention, the first-print layer may be a wafer stepper having a narrow field, such as 25 millimeters (mm)×25 mm, while the second-print layer may be a wafer stepper having a wide field, such as 50 mm×25 mm. This may result in a 1:2 non-concentric field-clustering scheme.

In another embodiment of the present invention, the field size of the second-print pattern may be an integer fraction (n:1) of the field size of the first-print pattern, where n may be 2, 3, 4, and so forth. Then, a single second-print of a narrow field may be placed over an integer fraction, such as ½, ⅓, or ¼, first-print of a wide field. Such a non-concentric field-clustering scheme may be referred to as 2:1, 3:1, or 4:1. In an embodiment of the present invention, the first-print layer may be a wafer scanner having a wide field, such as 32 mm×25 mm, while the second-print layer may be a wafer stepper having a narrow field, such as 16 mm×25 mm. This may result in a 2:1 non-concentric field-clustering scheme.

After completion of alignment of the reticle to the wafer, the imaging tool for the second-print pattern may use a stage, monitored with interferometers, to move the chuck holding the wafer to sequentially expose the photoresist in each field to radiation from a portion of an electromagnetic spectrum. In an embodiment of the present invention, the radiation may include ultraviolet (UV) light having a nominal wavelength of 436 nanometers (nm), 405 nm, or 365 nm, such as may be provided by a mercury lamp with the appropriate filters. In another embodiment of the present invention, the radiation may include deep ultraviolet (DUV) light having a nominal wavelength of 248 nm, 193 nm, or 157 nm, such as may be provided by an excimer laser with the appropriate gas. In still another embodiment of the present invention, the radiation may include extreme ultraviolet (EUV) light having a nominal wavelength selected from a range of about 10–15 nm, such as may be provided by a discharge-produced plasma (DPP) or a laser-produced plasma (LPP) in a target gas, such as Xenon.

The radiation may be transferred by the PO package from the source of illumination to the reticle and then the wafer on the chuck. The PO package may be refractive, reflective, or catadioptric. The reticle may be transmissive, such as for DUV light, or reflective, such as for EUV light, at the nominal wavelength of the incident radiation. The transmissive reticle may be formed by depositing an opaque material over a transparent substrate and then selectively removing the opaque material to define the pattern. The reflective reticle may be formed by depositing an absorbent material over a reflective substrate and then selectively removing the absorbent material to define the pattern.

The reticle may modulate amplitude and/or phase of the radiation to produce an aerial image. The pattern on the reticle may include features that may be physically oversized by a factor, such as 4. The PO package of the imaging tool may optically reduce the aerial image by a corresponding reciprocal of the factor, such as ¼, to produce the desired CD in the photoresist on the wafer. After being modulated by the reticle, the radiation may become incident on the photoresist on the wafer to produce a latent image.

A post-exposure bake (PEB) may be performed before developing the photoresist on the wafer. Then, the developed pattern formed from the latent image in the photoresist may be inspected and measured. The developed pattern should fall within acceptable tolerances for critical parameters, such as defect level, CD, and overlay for the layer of the IC device.

If the developed pattern does not meet control limits established for the critical parameters of the layer, the photoresist on the wafer may be reworked by stripping, followed by coating, exposing, and developing again. Once the second-print pattern complies with the control limits, the photoresist may be treated and stabilized.

In an embodiment of the present invention, an etch may transfer the second-print pattern from the developed photoresist on the wafer into underlying layers after which the photoresist may be stripped and the wafer may be cleaned. Then, the final pattern, such as an etched pattern in the underlying layers, may be inspected and measured.

The final pattern, such as the etched pattern, should meet the design specifications for the critical parameters, such as defect level, CD, and overlay. Compared with the developed pattern overlay measurement, a final overlay measurement, such as a post-etch overlay measurement, may correlate more closely with overlay in the IC device since overlying films that may interfere with the overlay measurement may have been removed, such as by the etch.

Overlay may refer to a placement error in overlapping the features in the second-print pattern relative to the features in the first-print pattern. The second-print pattern may include a developed pattern that may be printed at a current layer, such as by exposing and developing photoresist. The first-print pattern may include a reference pattern that may have been formed in the wafer at an earlier layer, such as by printing and etching.

The critical parameters, such as overlay, may be monitored as an integral part of in-line control of tools and processes during the manufacturing of the IC devices. In an embodiment of the present invention, the overlay of two layers of interest may be measured on a wafer that has been processed on the imaging tool with known settings for the tool parameters.

In an embodiment of the present invention, the relative placement error may be called centerline-to-centerline overlay when the actual CDs of the features for the two layers of interest are not taken into account. In another embodiment of the present invention, the relative placement error may be called edge-to-edge overlay when the actual CDs of the features for the two layers of interest are taken into account.

According to an embodiment of the present invention, the next step in optimizing the sample plan for overlay may be to select an initial sample plan to measure overlay at certain sampling sites on the wafer and in the field (FIG. 1, block 200).

In an embodiment of the present invention, the initial sample plan may include 10–15 sampling sites. In another embodiment of the present invention, the initial sample plan may include 20–25 sampling sites.

In an embodiment of the present invention, the sampling sites for the initial sample plan may be selected randomly. In another embodiment of the present invention, the sampling sites for the initial sample plan may be selected empirically.

Empirically-derived guidelines for choosing the sampling sites may include some or all of the following criteria:
(i) The sampling sites should be located at different radial positions relative to the center of the wafer.
(ii) The sampling sites should be located at different angular positions relative to the notch of the wafer.
(iii) The sampling sites should be located 5 mm or more inwards from the edges of the wafer.
(iv) Two or fewer of the sampling sites should be located in the same field on the wafer.
(v) Fifteen percent or more of the sampling sites should be located in each quadrant of the wafer.
(vi) Ten percent or more of the sampling sites should be located in each field position when the field has four corner positions and one center position.
(vii) The sampling sites which share the same field position, such as a particular corner position, should be distributed across different rows of the wafer.
(viii) The sampling sites which share the same field position, such as a particular corner position, should be distributed across different columns of the wafer.
(ix) The sampling sites should be distributed equally between odd rows and even rows of the wafer.
(x) The sampling sites should be distributed equally between odd columns and even columns of the wafer.

In certain situations, problems may arise when measuring the overlay of the developed pattern in the IC device in the die. The developed pattern overlay measurement may be adversely affected by variability in topography, step height, film thickness, layer reflectivity, surface roughness, and graininess across the wafer.

In such a case, the developed pattern overlay may be measured in a test structure. The test structure may include features from two or more layers of interest. The test structure should be robust enough to accommodate process variation that may introduce noise into the measurement of overlay. In an embodiment of the present invention, the test structure may be located on a non-product wafer, such as a test wafer.

In another embodiment of the present invention, the test structure may be located in the scribeline between neighboring dice on a product wafer. In another embodiment of the present invention, the test structure may be embedded within a non-active area of the die on the product wafer. In still another embodiment of the present invention, the test structure may include a portion of an active area of the die on the product wafer.

According to an embodiment of the present invention, the next step in optimizing the sample plan for overlay may be to establish an initial model for overlay (FIG. 1, block 300).

In the initial model for overlay, the overlay may be algebraically decomposed into a set of components. In an embodiment of the present invention, the components may include systematic overlay components and residual overlay components.

In an embodiment of the present invention, the systematic overlay components may include grid, or interfield, systematic overlay components and field, or intrafield, systematic overlay components. The interfield systematic overlay components may affect precision of placement of field centers in a grid of rows and columns across the wafer. The intrafield systematic overlay components may affect precision of placement of features in the pattern within each field in the grid.

In an embodiment of the present invention, the systematic overlay components may correspond to adjustable parameters of the imaging tool. The adjustable parameters of the imaging tool may involve mechanical or optical subsystems. Certain systematic overlay components may be predominantly mechanically-induced, such as reticle misalignment, wafer misalignment, stage-stepping inaccuracies, chuck-leveling inaccuracies, focusing imprecision, and scanning inaccuracies. Other systematic overlay components may be predominantly optically-induced, such as aberrations or distortions in the PO package, electron-beam writing/stitching errors in the pattern on the reticle, interactions between the PO and the reticle, non-homogeneous illumination, and non-uniform coherence.

The systematic overlay components may include linear terms, such as zeroth-order terms and first-order terms. The zeroth-order terms may remain constant across the wafer so their values may not vary by location. The zeroth-order terms may include x-offset and y-offset. Offset may also be known as shift or translation. The offset contributed by the wafer and the field cannot be distinguished or separated from each other.

The first-order terms may be a function of (x+y) on the wafer. Each location in the wafer may be identified by x- and y-coordinates that may be referenced to the stage of the imaging tool. The first-order wafer terms may include x-grid magnification, y-grid magnification, grid rotation, and grid orthogonality. Grid magnification may also be known as scale. Grid orthogonality may also be known as grid skew. The first-order field terms may include iso-field magnification and field rotation.

In another embodiment of the present invention, various types of imaging tools may be used. This may require mix-and-match of the imaging tool for the first-print pattern with the imaging tool for the second-print pattern. In an embodiment of the present invention, an optical imaging tool may be mix-and-matched with an electron-beam (e-bean) writer. The e-beam writer may utilize raster-scan or vector-scan. In another embodiment of the present invention, a 1×-projection wafer aligner may be mix-and-matched with a 10×- or a 5×-reduction wafer stepper. In still another embodiment of the present invention, a 1×-wafer stepper may be mix-and-matched with a 5×-reduction wafer stepper. In yet another embodiment of the present invention, a 5×-reduction wafer stepper may be mix-and-matched with a 4×-reduction wafer scanner.

The different types of imaging tools may be calibrated and matched. First, the grid for each of the imaging tools may be corrected relative to a reference grid on a golden standard wafer. The golden standard wafer may be traceable back to an absolute grid on an industry-wide calibration artifact. Second, the grids for all the different imaging tools may be matched. Third, the fields for all the different imaging tools may be matched. Fourth, the grid and the field for each of the imaging tools may be matched.

Next, the setting for each parameter of each imaging tool may be adjusted, as needed. In an embodiment of the present invention, the setting may be specific to the imaging tool. In another embodiment of the present invention, the setting may be specific to the reticle. In still another embodiment of the present invention, the setting may be specific to the layer of the IC device. In yet another embodiment of the present invention, the setting may be specific to a product.

For a concentric field clustering scheme, the overlay at any sampling site on the wafer may be expressed as a linear combination of the components relative to the distance from the wafer center for the grid components and relative to the distance from the common field center for the field components.

In an embodiment of the present invention, the overlay model for the wafer stepper may include eight systematic error components, such as x-offset, y-offset, x-grid magnification, y-grid magnification, wafer rotation, wafer orthogonality, iso-field magnification, and field rotation, for a total of eight adjustable tool parameters:

$$\text{Overlay} = \beta_{XOffset} X_{XOffset} + \beta_{YOffset} X_{YOffset} + \beta_{X\text{-}grid\ mag} X_{X\text{-}grid\ mag}$$
$$+ \beta_{Y\text{-}grid\ mag} X_{Y\text{-}grid\ mag} + \beta_{Grid\ Rot} X_{Grid\ Rot} + \beta_{Ortho} X_{Ortho}$$
$$+ \beta_{Iso\text{-}fld\ mag} X_{Iso\text{-}fld\ mag} + \beta_{FldRot} X_{FldRot}$$

In an embodiment of the present invention, the overlay model for the wafer scanner may include two additional systematic overlay components, such as x-field magnification and field skew, for a total of ten adjustable tool parameters:

$$\text{Overlay} = \beta_{XOffset} X_{XOffset} + \beta_{YOffset} X_{YOffset} + \beta_{X\text{-}grid\ mag} X_{X\text{-}grid\ mag}$$
$$+ \beta_{Y\text{-}grid\ mag} X_{Y\text{-}grid\ mag} + \beta_{Grid\ Rot} X_{Grid\ Rot} + \beta_{Ortho} X_{Ortho}$$
$$+ \beta_{Iso\text{-}fld\ mag} X_{Iso\text{-}fld\ mag} \beta_{X\text{-}fld\ mag} X_{X\text{-}fld\ mag}$$
$$+ \beta_{FldRot} X_{FldRot} + \beta_{FldSkew} X_{FldSkew}$$

Depending on the degrees of freedom designed into the imaging tool, the linear terms of the systematic overlay components may be fully correctable for a concentric field-clustering scheme, at least, in theory. Thus, the linear terms of the systematic overlay components may also be known as correctable overlay components.

However, the overlay for a non-concentric field-clustering scheme may be more complicated to model than the overlay for a concentric field-clustering scheme since, in a non-concentric field-clustering scheme, the center of the second-print pattern is not placed over the center of the first-print pattern. Thus, for a non-concentric field-clustering scheme, the field center for the second-print pattern must be distinguished from the field center for the first-print pattern.

For a non-concentric field-clustering scheme, the overlay at any site on the wafer may be expressed as a linear combination of the components relative to the distance from the wafer center for the grid components and relative to the respective distance from the appropriate field center for the field components:

The overlay model, whether for a concentric or a non-concentric field-clustering scheme, may also accommodate other systematic overlay components if desired. In an embodiment of the present invention, the overlay model may include nonlinear terms, such as second-order terms. The second-order terms may include x-trapezoid and y-trapezoid terms. The second-order terms are a function of $(x+y)^2$ on the wafer.

In another embodiment of the present invention, the overlay model may include other higher-order terms, such as third-order ($D_3$) terms and fifth-order ($D_5$) terms. The third-order terms are a function of $(x+y)^3$ on the wafer. The fifth-order terms are a function of $(x+y)^5$ on the wafer.

Even with the inclusion of higher-order terms for the systematic overlay components, the residual overlay components that may remain may still be difficult to isolate, characterize, quantify, and minimize. In an embodiment of the present invention, the residual overlay components may include indeterminate overlay components. In another embodiment of the present invention, the residual overlay components may include random overlay components. In still another embodiment of the present invention, the residual overlay components may include noise, such as in stage stepping or in overlay metrology. In yet another embodiment of the present invention, the residual overlay components may include mismatches between mechanical or optical subsystems of the imaging tools, such as the stages or the PO packages.

In practice, the nonlinear terms of the systematic overlay components may be difficult to adjust, especially when limited by the design or layout of the mechanical or optical subsystems of the imaging tool. In an embodiment of the present invention, the trapezoid terms of the systematic overlay components may be inherent in the stage of the imaging tool as installed. In another embodiment of the present invention, the third-order terms and the fifth-order terms of the systematic overlay components may be intrinsic to the PO package of the imaging tool as fabricated. Consequently, in order to simplify data analysis, the non-linear terms of the systematic overlay components may be lumped in with the residual overlay components in an embodiment of the present invention.

According to an embodiment of the present invention, the next step in optimizing the sample plan for overlay may be to construct matrices, such as a design matrix, a covariance matrix, and a correlation matrix, so as to improve efficiency of the model for overlay (FIG. 1, block 400).

An (m×n) matrix may be a set of real numbers or complex numbers, $a_{ij}$, arranged in m rows and n columns.

Y=X b where X=design matrix.

The matrix Y may include response variables (or dependent variables) based on observations made in a design space (or region of interest). In an embodiment of the present invention, the matrix Y may include overlay measured at certain sites on the wafer according to a sample plan.

The matrix X (or design matrix) may include explanatory variables or attributes (or factors or independent variables) in a physical system. In an embodiment of the present invention, the matrix X may include components of overlay in a model of the imaging tool.

The matrix b may include coefficients or estimators (or unknown parameters) of the matrix X. In an embodiment of the present invention, the matrix b may include least squares estimators to fit the measured overlay to the model for overlay. A least squares method includes a criterion to minimize a sum of the squared differences (or deviations) between the data and the model.

In another embodiment of the present invention, the matrix b may include linear regression estimators to fit the measured overlay data to the model for overlay. Linear regression may be a special case of the least squares method where the model may be linear in the estimators, but may not be linear in the explanatory variables.

The estimators may be considered to be unbiased if the expectation value of the error of the prediction is equal to zero. The estimators may be considered to be consistent if the expectation value of the error and the variance of the error both vanish for an infinitely large sample size. The variance is a measure of the fluctuation, deviation, or uncertainty in the error. The estimators may be considered to be efficient if the variance approaches a minimum.

A transpose X' may be obtained by exchanging the rows and the columns of the design matrix X.

$$X'Y = X'Xb$$

A product of the design matrix and its transpose (X'X) may be defined as an information matrix. Alternatively, an inverse of the information matrix $(X'X)^{-1}$ may be defined as a covariance matrix.

The covariance matrix is a measure of the extent of linear dependence of the variances of the components of overlay in the model. The covariance matrix may also be known as a variance-covariance matrix or a dispersion matrix. The covariance matrix may be symmetric, positive, and semi-definite if all of the eigenvalues are real and nonnegative. Symmetry refers to a property in which a matrix and its transpose are identical.

The main diagonal elements ($a_{ij}$ for i=j) of the covariance matrix represent the variances of the explanatory variables (or components of overlay in the model).

$$Var(\hat{\beta}_i) = diag(X'X)^{-1}$$

The off-diagonal elements ($a_{ij}$ for i not=j) of the covariance matrix represent the covariances between each pair of explanatory variables (or components of overlay in the model). The variances and the covariances may include values having units such as (nanometers)$^2$, (parts per million)$^2$, or (microradians)$^2$.

$$(X'X)^{-1}X'Y = (X'X)^{-1}(X'X)b$$

However, the product of a matrix and its inverse is equal to an identity matrix. The identity matrix is a special case of a diagonal matrix for which $a_{ij}=1$ for i=j (the main diagonal elements). The diagonal matrix is a matrix for which $a_{ij}=0$ for i not=j (the off-diagonal elements).

Therefore, the matrix for the coefficients or estimators, b, of the design matrix X may be obtained as follows:

$$b = (X'X)^{-1}X'Y$$

Once the coefficients, b, of the components of overlay in the model of the system have been determined, the overlay at any point on the wafer may be predicted based upon the coordinates.

$$Y_i = X_i b$$

According to an embodiment of the present invention, the next step in optimizing the sample plan for overlay may be to identify the redundant components and eliminate them (FIG. 1, block 500) so as to improve efficiency of the model for overlay.

First, a scaling factor may be defined:

$$\text{scaling factor} = \xi = \frac{1}{\sqrt{diag(X'X)^{-1}}}$$

Then, the covariance matrix may be scaled by the scaling factor to obtain a correlation matrix.

$$\text{correlation matrix} = \xi(X'X)^{-1}\xi$$

The correlation matrix is a measure of the extent of linear dependence of the components of overlay.

A zero value for the correlation matrix may indicate that the components of overlay are independent. If the components are independent, then they are uncorrelated. However, the converse is not true since components that are uncorrelated may not be independent.

Particularly for more complicated alignments, such as mix-and-match of different types of imaging tools or such as a non-concentric field-clustering scheme, the overlay model that may include all of the available components of the imaging tool may not always yield a unique solution for the set of equations since some components may be collinear with others. When two collinear components are described simultaneously in the system, a contribution from one component may be attributed to the other component. Components that may be collinear may also be known as mixed, confused, confounded, aliased, or redundant.

A non-zero value, either positive or negative, for the correlation matrix may indicate that the components of overlay may be collinear. Regardless of the sample plan selected, when two or more components are fully collinear, the information matrix (X'X) may not be invertible and the correlation matrix=$\xi(X'X)^{-1}\xi$ would not be defined.

Next, a variance inflation factor may be defined:

$$\text{variance inflation factor} = diag(\xi[X'X]^{-1}\xi)^{-1}$$

The variance inflation factor is a measure of the extent to which the variances of the components of overlay may have been inflated by the presence of collinearity between two or more components of overlay.

The criterion for deciding which one of the two components in each pair of collinear components should be selected may depend upon a consideration of the alignment strategy being used.

In an embodiment of the present invention, the components of the imaging tool for the second-print pattern should be retained in the overlay model rather than the components of the imaging tool for the first-print pattern because the components for the second-print pattern may be adjustable during an alignment, such as after a rework of the photoresist coated on the wafer.

In another embodiment of the present invention, the field components should be retained in the overlay model rather than the grid components because the field components may be more unstable and hence may require more frequent adjustment compared to the grid components.

In some embodiments of the present invention, the correlation between two components in the overlay model may be less than and close to 1.0. Then, one component from each pair of components identified as being redundant should be replaced.

In an embodiment of the present invention, it may become apparent that 2 pairs of components may be redundant, such as x-offset and y-offset. In other words, the x-offset in the first print layer may be compensated by the x-offset of the second-print layer and the y-offset in the first print layer may be compensated by the y-offset of the second-print layer. Therefore, the x-offset and the y-offset of the second-print layer may be retained in the overlay model since they may adjustable during an alignment, such as after a rework of the photoresist coated on the wafer.

According to an embodiment of the present invention, the next step in optimizing the sample plan for overlay may be to identify the highly-correlated components and determine whether to eliminate them so as to further improve efficiency of the model for overlay (FIG. 1, block 600).

Just as for the redundant components, similar guidelines may be followed for the highly-correlated components. In some embodiments of the present invention, the correlation between two components in the overlay model may be between 0.5 and 1.0. Then, one component from each pair of components identified as being highly-correlated may be replaced.

In an embodiment of the present invention, the wafer rotation and the field rotation of the first-print layer and the wafer rotation and the field rotation of the second-print layer may be highly correlated. Therefore, the second-print layer wafer rotation and field rotation and the first-print layer field rotation may be retained in the overlay model.

In another embodiment of the present invention, the second-print layer x-grid magnification, y-grid magnification, and wafer orthogonality may be eliminated from the overlay model.

According to an embodiment of the present invention, the efficient model for overlay may be established after constructing matrices and eliminating the redundant components and the appropriate highly-correlated components (FIG. 1, block 700).

According to an embodiment of the present invention, the next step in optimizing the sample plan for overlay may be to revise the initial sample plan (FIG. 1, block 800).

A set of equations, such as in the model for overlay, may be considered to be consistent if solutions exist. The set of equations may be considered to be inconsistent if solutions do not exist. More particularly, a set of m independent equations expressed in terms of n unknown variables, such as the components of overlay, may be considered to be over-determined (if m>n), exactly determined (if m=n), or under-determined (if m<n).

Thus, the number of components in the overlay model may depend not only on the degrees of freedom in the underlying physical system (such as the imaging tool), but also on the types of unique information that may be extracted from the measured overlay data. In an embodiment of the present invention, the components of overlay that may remain in the model for overlay may be orthogonal.

Thus, reducing the number of components while constructing the efficient model for overlay may permit the number of sampling sites in the sample plan to be reduced.

Then, the sample plan may be changed slightly and optimized iteratively with the use of a search algorithm and a Monte Carlo simulation.

In an embodiment of the present invention, dynamic sampling for overlay may be performed. In order to achieve efficiency in overlay measurement, the number of sampling sites may be minimized. Theoretically, the minimum number of sampling sites may be equal to half the number of components defined in the overlay model. Hence, the number of measured overlay sampling sites (x and y overlay measurements at each site) may be equal to the number of components. However, in part due to measurement uncertainties, the number of measured overlay sampling sites may be larger than the theoretical minimum.

An experimental design is a plan for performing an experiment to study the effects of various factors on response variables (or dependent variables) for a product or a process. A factor of a design is an explanatory variable or attribute (of the product or the process) that has two or more levels. A level is a fixed value. The design may be considered to be orthogonal if each effect may be estimated independently of the other effects. The design may be considered to be balanced if each level occurs equally often within each factor.

In an embodiment of the present invention, the experimental design may include the sample plan for measuring overlay. The response variables (or dependent variables), such as the matrix Y, may include the overlay. The explanatory variables or attributes (or factors or independent variables), such as the matrix X, may include the components of overlay in a model of the imaging tool.

Classical designs that may be used for performing a statistically-based design of experiments (DEX or DOE) may include full-factorial designs, fractional factorial designs, Latin square designs, Plackett-Burman designs, and Box-Behnken designs.

A full-factorial design includes all possible combinations of the levels of the factors. In the full-factorial design, all the effects and interactions (two-way as well as higher-order) are estimable and uncorrelated. The full-factorial design is orthogonal and balanced.

However, in many situations, practical constraints on the process, such as the amount of resources or time available, may prevent use of the classical designs. Typical user constraints may include (i) the maximum number of experimental runs or trials allowed by cost or time may be too small or irregular, (ii) some combinations of factor levels specified to maintain orthogonality or balance may be too difficult or impossible to run, (iii) the number of factors and/or the number of levels of some factors intended for use may not be included in the classical designs, or (iv) the underlying model assumed by the user may be too complicated or non-linear.

In order to avoid resorting to an ad hoc design to circumvent the existing user constraints, an optimal design may be generated iteratively by using a search algorithm. The search algorithm may include a series of random, sequential, or simultaneous steps. The search algorithm may be selected based on efficiency and effectiveness in generating the optimal design. Efficiency may include speed of convergence, such as fewer iterations or simpler computations. Effectiveness may include convergence on a global optimal solution rather than on a local optimal solution. A full iteration may result in evaluation of every sampling site in the sample plan.

In a first embodiment of the present invention, a single-point incremental algorithm may start with an empty or minimum-sized design, add one sampling site at a time to the sample plan, check for convergence, and continue iterating until the sample plan is optimized.

In a second embodiment of the present invention, a multiple-point incremental algorithm may start with an empty or minimum-sized design, add certain multiple sampling sites at a time to the sample plan, check for convergence, and continue iterating until the sample plan is optimized.

In a third embodiment of the present invention, a single-point decremental algorithm may start with a large or maximum-sized design, remove one sampling site at a time from the sample plan, check for convergence, and continue iterating until the sample plan is optimized.

In a fourth embodiment of the present invention, a multiple-point decremental algorithm may start with a large or maximum-sized design, remove certain multiple sampling sites at a time from the sample plan, check for convergence, and continue iterating until the sample plan is optimized.

In a fifth embodiment of the present invention, a single-point sequential exchange algorithm may start with a fixed-sized design, add one sampling site, check for convergence, remove another sampling site, check for convergence again, and continue iterating until the sample plan is optimized.

In a sixth embodiment of the present invention, a multiple-point sequential exchange algorithm may start with a fixed-sized sample plan, add certain multiple sampling sites, check for convergence, remove other multiple sampling sites, check for convergence again, and continue iterating until the sample plan is optimized.

In a seventh embodiment of the present invention, a single-point simultaneous exchange (or interchange) algorithm may start with a fixed-sized sample plan, add one sampling site and remove another sampling site, check for convergence, and continue iterating until the sample plan is optimized.

In an eighth embodiment of the present invention, a multiple-point simultaneous exchange (or interchange) algorithm may start with a fixed-sized sample plan, add certain multiple sampling sites and remove other multiple sampling sites, check for convergence, and continue iterating until the sample plan is optimized.

Optimal designs that may be used may include D-, A-, E-, G-, and V-optimal designs. Some designs may be based on optimality criteria for the coefficients or estimators, such as the linear regression estimators for the components of overlay. The determinant-optimal (or D-optimal) design minimizes the generalized variance of the linear regression estimators for the components of overlay. The average-optimal (or A-optimal) design minimizes the average variance of the linear regression estimators for the components of overlay.

Other designs may be based on optimality criteria for the dependent variables, such as the response variables, in the design space (or region of interest), such as the overlay measured at certain sites on a wafer. The E-optimal design maximizes the minimum eigenvalue of the information matrix of the design. The global-optimal (or G-optimal) design minimizes the maximum (or largest-expected or worst case) variance of the predicted values of the design. G-optimality may also be known as a minimax criterion. The V-optimal design minimizes the average variance of the predicted values of the design. The V-optimal design may also be known as IV-optimal design or Q-optimal design.

Out of these designs, only the D-optimal design is invariant under reparameterization. The D-optimal design maximizes the determinant of the information matrix of the design. The determinant is a product of the eigenvalues, which is inversely proportional to a product of the axes of the confidence region (or ellipsoid) so the D-optimal design also minimizes the volume of the confidence region.

The optimal design may be used so long as (a) an appropriate model of the underlying process is designated by the user and (b) a suitable superset of candidate points is specified by the user from which to generate the best subset of design points. The quality of the conclusions drawn from the design, data, and analysis may depend upon the correctness of the model that has been assumed. The amount of computation required may depend upon the size of the superset of candidate points and the efficiency of the search algorithm.

According to an embodiment of the present invention, the next step in optimizing the sample plan for overlay may be to reconstruct the matrices, such as a new design matrix, a new covariance matrix, and a new correlation matrix, for each change in the sample plan (FIG. 1, block 900). Then, the covariance matrix may be applied to calculate variance and model and predict overlay for each sampling site on the wafer.

The variances of the overlay at any point on the surface of the wafer may be described as follows:

$$\text{Var}(\hat{y}_i) = s^2 [x'_i (X'X)^{-1} x_i]$$

$$\max[\text{Var}(\hat{y}_i)]$$

The $\max[\text{Var}(\hat{y}_i)]$ may be used as a metric for optimizing the initial sample plan, such as for use with a specific combination of product die, wafer layout, and imaging tool. In an embodiment of the present invention, an iterative technique may be used to generate a G-optimal sample plan that may result in the lowest variances for the predicted overlay at any site on the wafer. An experimental design that minimizes the $\max[\text{Var}(\hat{y}_i)]$ within the design space (or region of interest) may be called a G-optimal design.

If the maximum of the variances decreases for a particular change in the initial sample plan, the change will be allowed. Otherwise, the initial sample plan will be left unchanged. The procedure will be repeated until the change in the maximum variance becomes insignificant, such as less than about 10%, after a full iteration of all the sampling sites in the initial sample plan.

According to an embodiment of the present invention, the next step in optimizing the sample plan for overlay may be to perform a Monte Carlo simulation (FIG. 1, block 1000). A problem may be formulated as an integration of a function over a multi-dimensional volume where the average of the function is obtained by randomly exploring the volume. The method used for integration may include hit-and-miss Monte Carlo or crude Monte Carlo.

Prior to performing the Monte Carlo simulation, the number of iterations, such as to generate 100–1,000 synthetic sets of data, and the confidence level, such as 0.68, may be specified. An assumption may be made that a best-fit distribution will represent the true data. Another assumption may be made that the error distribution of each point on the surface of the wafer may be Gaussian (normal).

Unlike a numerical discretization method that may be applied to an ordinary or partial differential equation that may describe an aspect of an underlying physical system, the Monte Carlo method is a statistical simulation method that may be applied to a function, such as a probability density function (PDF), that may describe some aspect of the underlying physical system. The PDF is analogous to an experimental distribution of observations or measurements.

The PDF may be normalized. Once the PDF is known, the Monte Carlo simulation may proceed by stochastic (random) sampling of the PDF.

The standard error for the Monte Carlo simulation may decrease proportionally with a square root of the sample size. However, simply increasing the sample size to reduce the standard error may quickly become impractical since extensive computation may be incurred. Consequently, reducing the variance may be a better way to decrease the standard error. Techniques for decreasing the variance include antithetic variates, control variates, importance sampling, and stratified sampling.

According to an embodiment of the present invention, an intermediate sample plan may be established after revising the initial sample plan, reconstructing the matrices, and performing the Monte Carlo simulation (FIG. 1, block 1100). The intermediate sample plan may be applied to the alignment of the second-print pattern on the reticle to the first-print pattern on the wafer.

Next, the current candidate design matrix may be optimized, such as by minimizing $\max[\text{Var}(\hat{y}_i)]$. Various algorithms may be used to change and optimize the sample plan iteratively. The algorithms may be classified based on how the algorithms change the sampling points. The classifications may also be known as ranks.

Some algorithms may start with an empty or minimum-sized design and add sampling sites iteratively until the sample plan is optimized. In an embodiment of the present invention, a single-point additive algorithm may be used which adds one sampling site at a time to the sample plan, computes $\max[\text{Var}(\hat{y}_i)]$, and continues iterating the process until the sample plan is optimized.

In another embodiment of the present invention, a multiple-point additive algorithm may be used which adds multiple sampling sites at a time to the sample plan, computes $\max[\text{Var}(\hat{y}_i)]$, and continues iterating until the sample plan is optimized.

Other algorithms may start with a large or maximum-sized design and remove sampling sites iteratively until the sample plan is optimized. In an embodiment of the present invention, a single-point subtractive algorithm may be used which deletes or removes one sampling site at a time from the sample plan, computes $\max[\text{Var}(\hat{y}_i)]$, and continues iterating the process until the sample plan is optimized.

In another embodiment of the present invention, a multiple-point subtractive algorithm may be used which removes multiple sampling sites at a time from the sample plan, computes $\max[\text{Var}(\hat{y}_i)]$, and continues iterating until the sample plan is optimized.

Still other algorithms may keep the sample size constant. In an embodiment of the present invention, a single-point sequential exchange algorithm may be used which adds one sampling site at a time, computes $\max[\text{Var}(\hat{y}_i)]$, removes another sampling site, computes $\max[\text{Var}(\hat{y}_i)]$ again, and continues iterating until the sample plan is optimized.

In another embodiment of the present invention, a multiple-point sequential exchange algorithm may be used which adds multiple sampling sites at a time, computes $\max[\text{Var}(\hat{y}_i)]$, removes other multiple sampling sites, computes $\max[\text{Var}(\hat{y}_i)]$ again, and continues iterating until the sample plan is optimized.

In still another embodiment of the present invention, a single-point simultaneous exchange (or interchange) algorithm may be used which adds one sampling site and removes another sampling site, computes $\max[\text{Var}(\hat{y}_i)]$, and continues iterating until the sample plan is optimized.

In yet another embodiment of the present invention, a multiple-point simultaneous exchange (or interchange) algorithm may be used which adds multiple sampling sites and removes other multiple sampling sites, computes $\max[\text{Var}(\hat{y}_i)]$, and continues iterating until the sample plan is optimized.

An algorithm may be selected based on its efficiency in generating an optimal design. Efficiency is a measure of the goodness of a design, such as relative to a hypothetical orthogonal design. In an embodiment of the present invention, a single-point type of algorithm may be more efficient than a multiple-point type of algorithm in generating an optimal design. A design may be referred to as an exact optimal design if it is the best possible design in the feasible matrix design space or region of interest. There may be more than one exact optimal design, especially when considering feasible matrix design spaces or regions of interest that may be closed and compact and functions that may be continuous.

In an embodiment of the present invention, dynamic sampling may involve changing the intermediate sample plan, such as by adding one or more sampling sites at a time, and checking for convergence (FIG. 1, block 1200).

The measured overlay at the additional sampling site(s) may be compared with the predicted overlay based on the model before the intermediate sample plan was changed. In an embodiment of the present invention, a delta may be determined. If the number of sampling sites is one more than the number of components of overlay, the same number of deltas should be collected.

Criteria may be set up to determine if additional sampling sites may be needed to further reduce the delta between the measured overlay and the predicted overlay until an acceptable value is obtained. In an embodiment of the present invention, a goodness-of-fit may be defined as the root-mean-square-error (RMSE) of the delta.

If the RMSE changes by less than an amount, such as about 5.0%, convergence may be considered to have been achieved. If the RMSE changes by more than the amount, the procedure may be repeated until the RMSE converges or until all of the sampling sites in the intermediate sample plan have been measured.

Another embodiment of the present invention includes using all of the sampling sites, except for one sampling site, for the analysis of the components of overlay. Again, the procedure may be repeated by switching or moving one or more sampling sites at a time and checking for convergence.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

We claim:

1. A method of optimizing a sample plan for overlay comprising:
   determining a field-clustering scheme;
   selecting an initial sample plan;
   establishing an initial model for overlay, said initial model of overlay comprising components; and establishing an efficient model for overlay from said initial model for overlay comprising:
constructing matrices;
identifying redundant components and eliminating said redundant component;
identifying highly-correlated components and determining whether to eliminate said highly-correlated components;
establishing an intermediate sample plan comprising:
revising said initial sample plan;
reconstructing said matrices; and
performing Monte Carlo simulation.

2. The method of claim 1 wherein said field-clustering scheme may comprise concentric fields.

3. The method of claim 1 wherein said field-clustering scheme may comprise non-concentric fields.

4. The method of claim 1 wherein said initial sample plan may be selected randomly.

5. The method of claim 1 wherein said initial sample plan may be selected empirically.

6. The method of claim 1 wherein said components may comprise systematic overlay components.

7. The method of claim 1 wherein said components may comprise residual overlay components.

8. The method of claim 6 wherein said systematic overlay components may comprise interfield systematic overlay components and intrafield systematic overlay components.

9. The method of claim 6 wherein said systematic overlay components may correspond to adjustable parameters of an imaging tool.

10. The method of claim 6 wherein said systematic overlay components may comprise linear terms.

11. The method of claim 1 wherein said matrices may comprise a design matrix.

12. The method of claim 1 wherein said matrices may comprise a covariance matrix.

13. The method of claim 1 wherein said matrices may comprise a correlation matrix.

14. The method of claim 1 wherein said matrices comprise a new design matrix.

15. The method of claim 11 wherein said matrices comprise a new covariance matrix.

16. The method of claim 1 wherein said matrices comprise a new correlation matrix.

17. The method of claim 1 further comprising:
dynamic sampling comprising:
measuring overlay;
modeling and predicting overlay;
comparing measured overlay with predicted overlay;
checking for convergence; and
changing said intermediate sample plan and iterating until said convergence is achieved.

18. The method of claim 17 wherein said checking for convergence comprises determining root-mean-square-error or RMSE.

* * * * *